(12) United States Patent
Li et al.

(10) Patent No.: US 11,469,289 B2
(45) Date of Patent: Oct. 11, 2022

(54) DISPLAY PANEL AND PREPARATION METHOD THEREOF, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Qian Li, Beijing (CN); Cuicui Liang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 142 days.

(21) Appl. No.: 17/000,428

(22) Filed: Aug. 24, 2020

(65) Prior Publication Data

US 2021/0098554 A1   Apr. 1, 2021

(30) Foreign Application Priority Data

Sep. 26, 2019 (CN) .......................... 201910919823.7

(51) Int. Cl.
*H01L 27/32* (2006.01)
*H01L 51/52* (2006.01)
*H01L 51/56* (2006.01)

(52) U.S. Cl.
CPC ...... *H01L 27/3276* (2013.01); *H01L 51/5284* (2013.01); *H01L 51/56* (2013.01); *H01L 2227/323* (2013.01)

(58) Field of Classification Search
CPC .................................................. H01L 27/3276
See application file for complete search history.

(56) References Cited

U.S. PATENT DOCUMENTS

| 2011/0221661 A1 | 9/2011 | Yoon et al. |
| 2013/0328479 A1* | 12/2013 | Jung .................. G02B 27/0006 313/504 |

(Continued)

FOREIGN PATENT DOCUMENTS

| CN | 102194853 A | 9/2011 |
| CN | 103489888 A | 1/2014 |

(Continued)

OTHER PUBLICATIONS

Office Action corresponding to Chinese Application 201910919823.7 dated Aug. 2, 2021.

*Primary Examiner* — Douglas M Menz
(74) *Attorney, Agent, or Firm* — ArentFox Schiff LLP; Michael Fainberg

(57) ABSTRACT

The disclosure discloses a display panel and a preparation method thereof, and a display device. The display panel includes a base substrate on which a plurality of repetitive units are arranged; each repetitive unit includes a display area, a transparent area and a metal wiring area; a ¼λ phase difference layer and a polarization layer arranged on the packaging layer and stacked in sequence, where the polarization layer is positioned on the side, far away from the packaging layer, of the ¼λ phase difference layer; the ¼λ phase difference layer and the polarization layer have openings in the direction perpendicular to the base substrate, and orthographic projections of the openings on the base substrate are positioned in the transparent area; and orthographic projections of the ¼λ phase difference layer and the polarization layer on the base substrate cover the display area.

10 Claims, 2 Drawing Sheets

(56) References Cited

U.S. PATENT DOCUMENTS

| | | |
|---|---|---|
| 2016/0172633 A1 | 6/2016 | Ahn et al. |
| 2017/0012085 A1* | 1/2017 | Lee |
| 2020/0013838 A1* | 1/2020 | Takechi .............. H01L 51/5215 |
| 2020/0335713 A1* | 10/2020 | Song ....................... G06F 3/045 |

FOREIGN PATENT DOCUMENTS

| | | |
|---|---|---|
| CN | 104659075 A | 5/2015 |
| CN | 105702704 A | 6/2016 |
| CN | 109767699 A | 5/2019 |
| CN | 110133788 A | 8/2019 |
| KR | 20130114374 A | 10/2013 |

* cited by examiner

DISPLAY PANEL AND PREPARATION METHOD THEREOF, AND DISPLAY DEVICE

This application claims priority to Chinese Patent Application No. 201910919823.7, filed Sep. 26, 2019, which is hereby incorporated by reference in its entirety.

FIELD

The disclosure relates to the field of display, in particular to a display panel and a preparation method thereof, and a display device.

BACKGROUND

The application environment of a vehicle-mounted display generally has strong ambient light. The ambient light may affect readability of the display. The larger the reflectivity of the display is, the worse the contrast ratio under the ambient light is, and the readability of the display may be greatly reduced.

SUMMARY

The disclosure discloses a display panel and a preparation method thereof, and a display device.

In a first aspect, the disclosure provides a display panel.

The display panel includes a base substrate and a plurality of repetitive units arranged on the base substrate in an array. Each repetitive unit includes a display area, a transparent area and a metal wiring area.

Each repetitive unit includes: a TFT driver layer arranged on the base substrate and positioned in the display area; a metal wire arranged in the metal wiring area; an OLED device layer arranged on the TFT driver layer; a packaging layer arranged on the OLED device layer and covering all the repetitive units; and a ¼λ phase difference layer and a polarization layer arranged on the packaging layer and stacked in sequence.

The transparent area is arranged between the display area and the metal wiring area. The polarization layer is positioned on the side, far away from the packaging layer, of the ¼λ phase difference layer; the ¼λ phase difference layer and the polarization layer are provided with openings in the direction perpendicular to the base substrate, and first orthographic projections of the openings on the base substrate are in the transparent area; and a second orthographic projection of the ¼λ phase difference layer on the base substrate covers the display area, and a third orthographic projection of the polarization layer on the base substrate covers the display area.

Optionally, the second orthographic projection further covers the metal wiring area; and the third orthographic projection further covers the metal wiring area.

Optionally, the polarization layer includes a polarizing material layer in which a light-sensitive material is doped.

Optionally, the polarizing material layer includes dichroic dyes and polymerizable liquid crystals.

Optionally, the dichroic dyes and the polymerizable liquid crystals are physically mixed; or the dichroic dyes are connected to molecules of the polymerizable liquid crystals in a branched-chain grafting manner.

Optionally, the each repetitive unit further includes a first alignment layer arranged on the side, facing the ¼λ phase difference layer, of the polarizing material layer, where the light-sensitive material is doped in the first alignment layer.

Optionally, the ¼λ phase difference layer includes a ¼λ polymerizable liquid crystal layer in which the light-sensitive material is doped.

Optionally, the each repetitive unit further includes a second alignment layer arranged between the ¼λ polymerizable liquid crystal layer and the corresponding packaging layer, where the light-sensitive material is doped in the second alignment layer.

In a second aspect, the disclosure provides a display device including the display panel provided by the above first aspect.

In a third aspect, the disclosure provides a method for preparing the display panel provided by the above first aspect.

The method includes: forming the TFT driver layer in the display area; forming the metal wire in the metal wiring area; forming the OLED device layer on the TFT driver layer; forming the packaging layer covering the each repetitive unit on the OLED device layer; forming the ¼λ phase difference layer on the packaging layer; patterning the ¼λ phase difference layer; removing a part, corresponding to the transparent area, of the ¼λ phase difference layer; forming the polarization layer on the patterned ¼λ phase difference layer; patterning the polarization layer; and removing a part, corresponding to the transparent area, of the polarization layer.

Optionally, the method further includes: forming a first alignment layer on the packaging layer; aligning the first alignment layer by UV-irradiation; forming a ¼λ polymerizable liquid crystal layer on the first alignment layer; and exposing and developing the first alignment layer and the ¼λ polymerizable liquid crystal layer; and removing parts, corresponding to the transparent area, of the first alignment layer and the ¼λ polymerizable liquid crystal layer.

Optionally, the method further includes: forming a second alignment layer on the patterned ¼λ phase difference layer; aligning the second alignment layer by UV-irradiation; forming a polarizing material layer on the second alignment layer, where the polarizing material layer includes a dichroic dye and polymerizable liquid crystals; exposing and developing the second alignment layer and the polarizing material layer; and removing parts, corresponding to the transparent area, of the second alignment layer and the polarizing material layer.

Icons: 1—base substrate; 2—TFT driver layer; 3—metal wire; 4—OLED device layer; 5—packaging layer; 6—¼λ phase difference layer; 7—polarization layer; 8—opening; 9—first alignment layer; 10—second alignment layer.

DETAILED DESCRIPTION OF THE EMBODIMENTS

The schemes in embodiments of the disclosure will be described in combination with the drawings of the embodiments of the disclosure. It is obvious that the described embodiments are only a part, and not all embodiments, of the disclosure. Based on the embodiments of the disclosure, those skilled in the art can obtain other embodiment(s), without any inventive labor, which all should be within the scope of the present disclosure.

Figure 1:
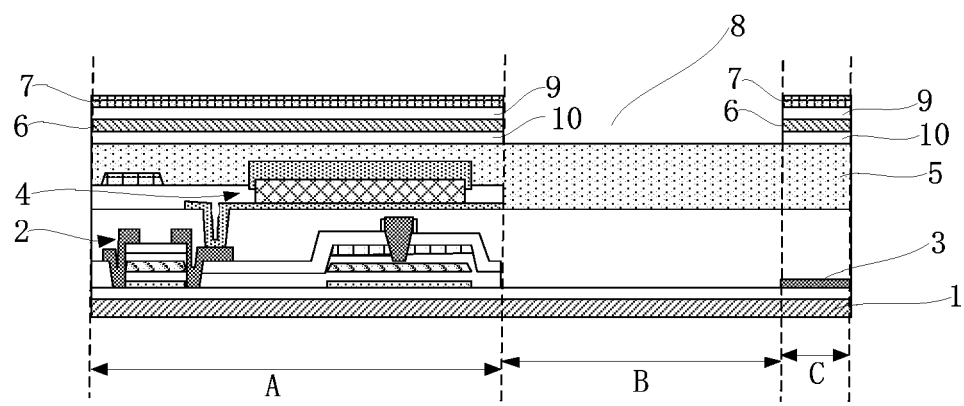
FIG. 1 is a structure diagram of a repetitive unit of a display panel according to the embodiments of the disclosure.

As shown in FIG. 1, the embodiments of the disclosure provide a display panel. The display panel includes a base substrate 1, and a plurality of repetitive units arranged on the base substrate in an array.

In some embodiments, each repetitive unit includes a display area (area A as shown in FIG. 1), a transparent area (area B as shown in FIG. 1) and a metal wiring area (area C as shown in FIG. 1). The transparent area is arranged between the display area and the metal wiring area.

The display area has a display function. Light rays can pass through the transparent area. The metal wiring area is provided with one or more metal wires 3.

In some embodiments, each repetitive unit includes a TFT driver layer 2 arranged on the base substrate 1 and positioned in the display area; one or more metal wires 3 arranged in the metal wiring area; an OLED device layer 4 arranged on the TFT driver layer 2; a packaging layer 5 arranged on the OLED device layer 4 and covering the whole repetitive unit; and a ¼λ phase difference layer 6 and a polarization layer 7 arranged on the packaging layer 5 and stacked in sequence.

In some embodiments, the polarization layer 7 is positioned on the side, far away from the packaging layer 5, of the ¼λ phase difference layer 6; the ¼λ phase difference layer 6 and the polarization layer 7 are provided with openings 8 in the direction perpendicular to the base substrate 1, and first orthographic projections of the openings 8 on the base substrate 1 are positioned in the transparent area; and a second orthographic projection of the ¼λ phase difference layer 6 on the base substrate and a third orthographic projection of the polarization layer 7 on the base substrate 1 cover the display area.

In some embodiments, the second orthographic projection further covers the metal wiring area; and the third orthographic projection further covers the metal wiring area.

The display panel mentioned above is a transparent display panel.

In the display panel mentioned above, the display area in each repetitive unit can be used for displaying images, and the light rays can pass through the transparent area, so that the whole display panel can achieve transparent display.

In some embodiments, the packaging layer 5 covering the whole repetitive unit is arranged on the TFT driver layer 2, that is, the packaging layer 5 covering the whole display panel is arranged on an outer side of the light outgoing side of the display panel to play a role in protecting and sealing.

In some embodiments, the ¼λ phase difference layer 6 and the polarization layer 7 are arranged on the packaging layer 5 and stacked in sequence, and openings 8, corresponding to the transparent area, are formed in the ¼λ phase difference layer 6 and the polarization layer 7, so that light transmittance of the transparent area of the display panel is not affected, and the light rays can directly pass through the display area.

In some embodiments, the orthographic projections of the openings on the base substrate can be overlapped with that of the display area on the base substrate, and the orthographic projections of the openings on the base substrate can also be set to be smaller than that of the display area on the base substrate, that is, the area of the opening can be set to be slightly smaller than that of the display area, which can be set according to actual requirements in this embodiment.

In some embodiments, the ¼λ phase difference layer 6 and the polarization layer 7 can cover the display area and the metal wiring area, reduce the reflectivity of the display area and the metal wiring area in the display panel, increase the contrast ratio of the display panel under the ambient light, and improve the readability of the display panel.

Figure 2:
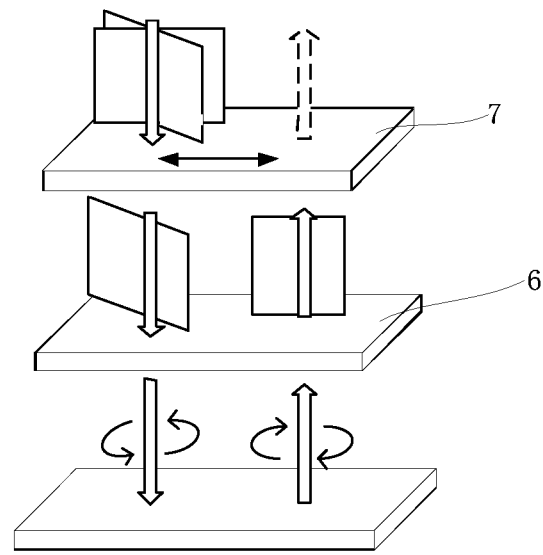
FIG. 2 is a principle diagram of reducing the reflectivity by the ¼λ phase difference layer and the polarization layer according to the embodiments of the disclosure.

FIG. 2 shows a principle of reducing the reflectivity by the ¼λ phase difference layer 6 and the polarization layer 7. When the ambient light passes through the polarization layer 7, linearly polarized light is formed; the linearly polarized light is converted into right-handed circularly polarized light (or right-handed polarized light) after passing through the ¼λ phase difference layer 6; half-wave loss is caused after the right-handed polarized light is reflected by a cathode or metal of the display area or metal wiring area, and the right-handed polarized light is converted into left-handed polarized light; then the circularly polarized light is converted into the linearly polarized light after passing through the ¼λ phase difference layer 6, at the moment, the polarization direction of the polarized light is parallel to an absorption axis of the polarization layer 7, and the light rays cannot transmit and thus are eliminated, so that the ¼λ phase difference layer 6 and the polarization layer 7 cover the display area and the metal wiring area, the reflectivity of the display area and the metal wiring area in the display panel can be reduced, and thus the contrast ratio of the display panel under the ambient light is effectively increased, and the readability of the display panel is improved.

Therefore, in the above display panel, the ¼λ phase difference layer 6 and the polarization layer 7 are arranged on the outer side of the packaging layer 5 of the display panel to form an anti-reflection layer, so that the reflectivity of the display area and the metal wiring area in the display panel can be effectively reduced, and thus the contrast ratio of the display panel under the ambient light is effectively increased, and the readability of the display panel is improved; and the openings, corresponding to the transparent area, are formed in the ¼λ phase difference layer 6 and the polarization layer 7, so that light transmittance of the transparent area is not affected, the transparent area keeps relatively high light transmittance, and thus the transparent display panel has the effects of high transmittance and low reflectivity.

In some embodiments, the packaging layer 5 may be a TFE packaging layer. By using the TFE packaging technology to package an OLED display panel, the packaged display panel is small in thickness and good in packaging airtightness, and thus the TFE packaging technology is particularly applicable to the flexible display panel.

In some embodiments, the polarization layer 7 includes a polarizing material layer in which a light-sensitive material is doped; the light-sensitive material is doped into the polarizing material layer, so that patterning of the polarizing material layer is conveniently realized by adopting an exposure and development technology in a preparation process, and an opening corresponding to the transparent area is conveniently formed.

In some embodiments, the polarizing material layer includes a dichroic dye and polymerizable liquid crystals, in which an existing form of the dichroic dye and the polymerizable liquid crystals may be a mixture of the dichroic dye and the polymerizable liquid crystals formed by simple physical mixing; optionally, the dichroic dye may be connected to the polymerizable liquid crystal molecules in a branched-chain grafting manner.

As shown in FIG. 1, in the display panel mentioned above, a first alignment layer 9 is arranged on the side, facing the ¼λ phase difference layer 6, of the polarizing material layer; the light-sensitive material is doped into the first alignment layer 9; the first alignment layer 9 is used for aligning the polymerizable liquid crystals in the polarizing material layer; and the light-sensitive material is doped into the first alignment layer 9, so as to be convenient for patterning.

In some embodiments, the ¼λ phase difference layer 6 includes a ¼λ polymerizable liquid crystal layer, and the light-sensitive material is uniformly doped into the ¼λ polymerizable liquid crystal layer; the light-sensitive material is doped into the ¼λ polymerizable liquid crystal layer, so that patterning of ¼λ polymerizable liquid crystal layer is conveniently realized by adopting an exposure and development technology in a preparation process, and the opening corresponding to the transparent area is conveniently formed.

As shown in FIG. 1, in the display panel mentioned above, a second alignment layer 10 is arranged between the ¼λ polymerizable liquid crystal layer and the packaging layer 5, and the light-sensitive material is doped into the second alignment layer 10; the second alignment layer 10 is used for aligning the polymerizable liquid crystals in the ¼λ polymerizable liquid crystal layer, and the light-sensitive material is doped into the second alignment layer 10, so as to be convenient for patterning.

Based on a same inventive concept, the embodiment of the disclosure also provides a display device including the display panel provided by any one of the embodiments mentioned above.

Figure 3:
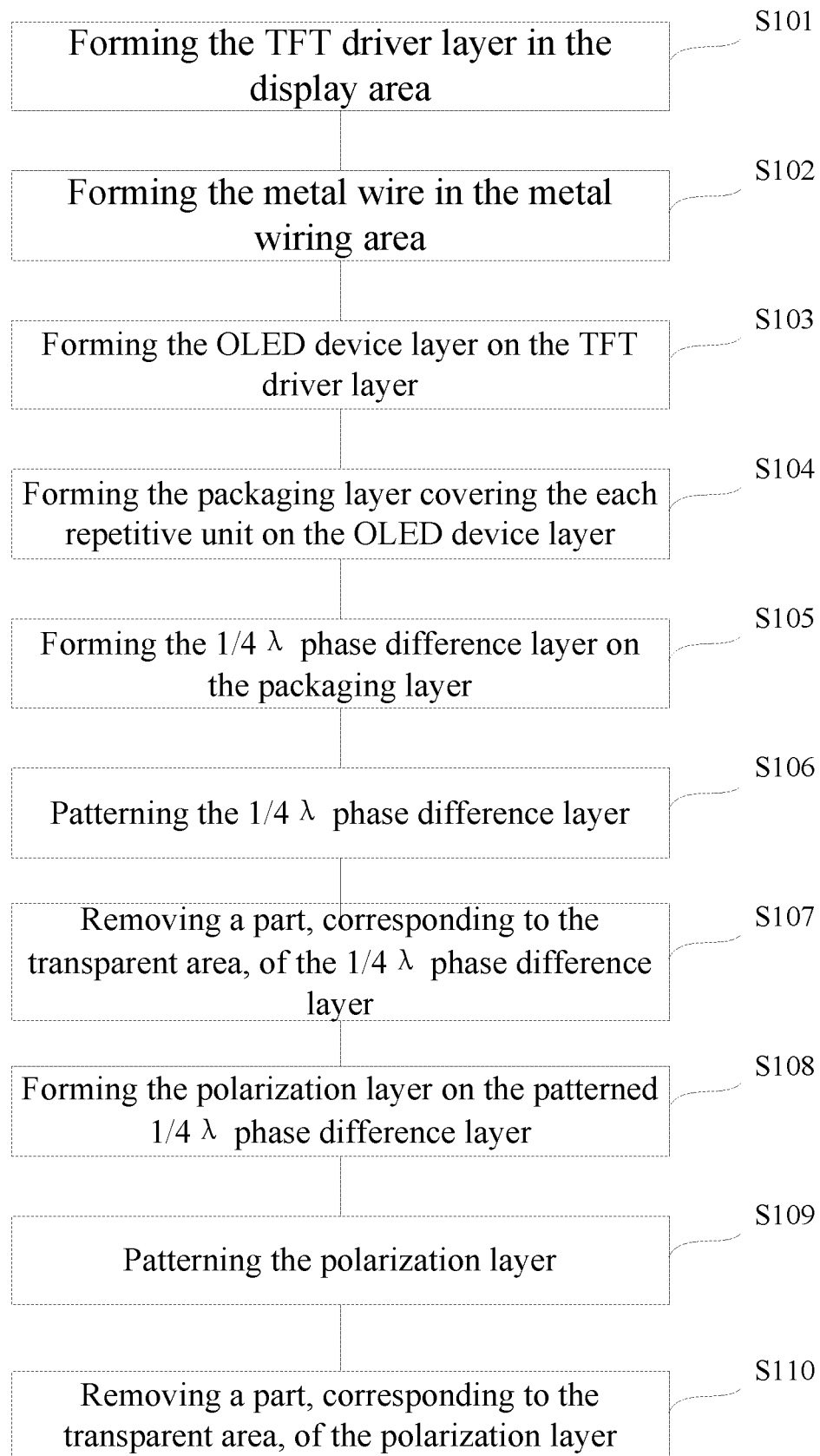
FIG. 3 is a schematic diagram of a method for preparing a display panel according to the embodiments of the disclosure.

Based on the same inventive concept, as shown in FIG. 3, the embodiment of the disclosure also provides a method for preparing the display panel provided by any one of the embodiments mentioned above. The method includes S101-S110.

S101, forming the TFT driver layer 2 on the base substrate 1 and in the display area.

S102, forming the metal wire 3 in the metal wiring area.

S103, forming the OLED device layer 4 on the TFT driver layer 2.

S104, forming the packaging layer 5 covering the whole repetitive unit on the OLED device layer 4.

S105, forming the ¼λ phase difference layer 6 on the packaging layer 5.

S106, patterning the ¼λ phase difference layer 6.

S107, removing the part, corresponding to a transparent area, of the ¼λ phase difference layer 6.

S108, forming the polarization layer 7 on the patterned ¼λ phase difference layer 6.

S109, patterning the polarization layer 7.

S110, removing the part, corresponding to the transparent area, of the polarization layer 7.

In the method for preparing the display panel, the ¼λ phase difference layer 6 and the polarization layer 7 are arranged on the outer side of the packaging layer 5, and patterning is carried out on the ¼λ phase difference layer 6 and the polarization layer 7 through an exposure and development technology to form the openings, corresponding to the transparent area, in the ¼λ phase difference layer 6 and the polarization layer 7, and thus, high light transmittance of the transparent area can be guaranteed; the ¼λ phase difference layer 6 and the polarization layer 7 cover the display area and the metal wiring area, so that the reflectivity of the display area and the metal wiring area in the display panel is effectively reduced, and thus the contrast ratio of the display panel under ambient light is effectively increased; the ¼λ phase difference layer 6 and the polarization layer 7 are patterned by adopting the exposure and development technology; and therefore, the preparation mode is simple and reliable, and high in accuracy.

In some embodiments, the step of forming the ¼λ phase difference layer 6 on the packaging layer 5, patterning the ¼λ phase difference layer 6, and removing the part, corresponding to the transparent area, in the ¼λ phase difference layer 6 further includes: forming a first alignment layer 9 on the packaging layer 5, and aligning the first alignment layer 9 by UV-irradiation; forming a ¼λ polymerizable liquid crystal layer on the first alignment layer 9; exposing and developing the first alignment layer 9 and the ¼λ polymerizable liquid crystal layer; and removing the parts, corresponding to the transparent area, of the first alignment layer 9 and the ¼λ polymerizable liquid crystal layer.

In some embodiments, the step of forming the polarization layer 7 on the patterned ¼λ phase difference layer 6, patterning the polarization layer 7, and removing the part, corresponding to the transparent area, of the polarization layer 7 further includes: forming a second alignment layer 10 on the patterned ¼λ phase difference layer 6; aligning the second alignment layer 10 by UV-irradiation; forming a polarizing material layer on the second alignment layer 10, where the polarizing material layer includes a dichroic dye and polymerizable liquid crystals; exposing and developing the second alignment layer 10 and the polarizing material layer; and removing parts, corresponding to the transparent area, of the second alignment layer 10 and the polarizing material layer.

Obviously, those skilled in the art can make various modifications and variations to the embodiments of the disclosure without departing from the spirit and scope of the disclosure. Therefore, if these modifications and variations of the disclosure fall within the scope of the claims of the disclosure and equivalent technologies thereof, the disclosure is also intended to include these modifications and variations.

What is claimed is:
1. A display panel, comprising:
a base substrate; and
a plurality of repetitive units arranged on the base substrate in an array;
wherein each repetitive unit comprises:
a display area; a transparent area; a metal wiring area;
a TFT driver layer arranged on the base substrate and positioned in the display area; a metal wire arranged in the metal wiring area;
an organic light-emitting diode (OLED) device layer arranged on the TFT driver layer;
a packaging layer arranged on the OLED device layer and covering the each repetitive unit; and
a ¼λ phase difference layer and a polarization layer arranged on the packaging layer and stacked in sequence;
wherein the transparent area is arranged between the display area and the metal wiring area;
the polarization layer is positioned on a side, far away from the packaging layer, of the ¼λ phase difference layer;
the ¼λ phase difference layer and the polarization layer have openings in a direction perpendicular to the base substrate;
first orthographic projections of the openings on the base substrate are in the transparent area;

a second orthographic projection of the ¼λ phase difference layer on the base substrate covers the display area; and
a third orthographic projection of the polarization layer on the base substrate covers the display area;
wherein the polarization layer comprises a polarizing material layer in which a light-sensitive material is doped; and
the ¼λ phase difference layer comprises a ¼λ polymerizable liquid crystal layer in which the light-sensitive material is doped.

2. The display panel according to claim 1, wherein
the second orthographic projection further covers the metal wiring area; and
the third orthographic projection further covers the metal wiring area.

3. The display panel according to claim 1, wherein the polarizing material layer comprises dichroic dyes and polymerizable liquid crystals.

4. The display panel according to claim 3, wherein
the dichroic dyes and the polymerizable liquid crystals are physically mixed; or
the dichroic dyes are connected to molecules of the polymerizable liquid crystals in a branched-chain grafting manner.

5. The display panel according to claim 1, wherein the each repetitive unit further comprises:
a first alignment layer arranged on a side, facing the ¼λ phase difference layer, of the polarizing material layer;
wherein the light-sensitive material is doped in the first alignment layer.

6. The display panel according to claim 1, wherein the each repetitive unit further comprises:
a second alignment layer arranged between the ¼λ polymerizable liquid crystal layer and the packaging layer;
wherein the light-sensitive material is doped in the second alignment layer.

7. A method for preparing the display panel of claim 1, comprising:
forming the TFT driver layer in the display area;
forming the metal wire in the metal wiring area;
forming the OLED device layer on the TFT driver layer;
forming the packaging layer covering the each repetitive unit on the OLED device layer;
forming the ¼λ phase difference layer on the packaging layer;
patterning the ¼λ phase difference layer;
removing a part, corresponding to the transparent area, of the ¼λ phase difference layer;
forming the polarization layer on the patterned ¼λ phase difference layer;
patterning the polarization layer; and
removing a part, corresponding to the transparent area, of the polarization layer.

8. The method according to claim 7, further comprising:
forming a first alignment layer on the packaging layer;
aligning the first alignment layer by UV-irradiation;
forming a ¼λ polymerizable liquid crystal layer on the first alignment layer;
exposing and developing the first alignment layer and the ¼λ polymerizable liquid crystal layer; and
removing parts, corresponding to the transparent area, of the first alignment layer and the ¼λ polymerizable liquid crystal layer.

9. The method according to claim 7, further comprising:
forming a second alignment layer on the patterned ¼λ phase difference layer;
aligning the second alignment layer by UV-irradiation;
forming a polarizing material layer on the second alignment layer, wherein the polarizing material layer comprises a dichroic dye and polymerizable liquid crystals;
exposing and developing the second alignment layer and the polarizing material layer; and
removing parts, corresponding to the transparent area, of the second alignment layer and the polarizing material layer.

10. A display device, comprising a display panel, wherein the display panel comprises:
a base substrate; and
a plurality of repetitive units arranged on the base substrate in an array;
wherein each repetitive unit comprises:
a display area;
a transparent area;
a metal wiring area;
a TFT driver layer arranged on the base substrate and positioned in the display area;
a metal wire arranged in the metal wiring area;
an organic light-emitting diode (OLED) device layer arranged on the TFT driver layer;
a packaging layer arranged on the OLED device layer and covering the each repetitive unit; and
a ¼λ phase difference layer and a polarization layer arranged on the packaging layer and stacked in sequence;
wherein the transparent area is arranged between the display area and the metal wiring area;
the polarization layer is positioned on a side, far away from the packaging layer, of the ¼λ phase difference layer;
the ¼λ phase difference layer and the polarization layer have openings in a direction perpendicular to the base substrate;
first orthographic projections of the openings on the base substrate are in the transparent area;
a second orthographic projection of the ¼λ phase difference layer on the base substrate covers the display area; and
a third orthographic projection of the polarization layer on the base substrate covers the display area;
wherein the polarization layer comprises a polarizing material layer in which a light-sensitive material is doped; and
the ¼λ phase difference layer comprises a ¼λ polymerizable liquid crystal layer in which the light-sensitive material is doped.

* * * * *